United States Patent [19]
Chen et al.

[11] Patent Number: 5,926,712
[45] Date of Patent: Jul. 20, 1999

[54] PROCESS FOR FABRICATING MOS DEVICE HAVING SHORT CHANNEL

[75] Inventors: Min-Liang Chen; Chih-Hsien Wang; Chih-Hsun Chu; San-Jung Chang, all of Hsinchu, Taiwan

[73] Assignee: Mosel Vitelic Inc., Hsinchu, Taiwan

[21] Appl. No.: 08/753,216

[22] Filed: Nov. 21, 1996

[51] Int. Cl.$^6$ ................................................. H01L 21/336
[52] U.S. Cl. ........................... 438/291; 438/302; 438/305
[58] Field of Search ................................... 438/291, 290, 438/289, 299, 302, 305, 306, 307

[56] References Cited

U.S. PATENT DOCUMENTS

| | | | |
|---|---|---|---|
| 4,397,887 | 8/1983 | Aytac et al. ................................ | 438/301 |
| 5,158,903 | 10/1992 | Hori et al. ................................ | 438/302 |
| 5,449,937 | 9/1995 | Arimura et al. ......................... | 257/345 |
| 5,466,957 | 11/1995 | Yuki et al. ................................ | 257/344 |
| 5,518,941 | 5/1996 | Lin et al. .................................. | 438/291 |

*Primary Examiner*—Michael Trinh
*Attorney, Agent, or Firm*—Nims Howes Collison Hansen & Lackert

[57] ABSTRACT

The present invention is related to a process for fabricating a MOS device having a short channel. The process according to the present invention includes the steps of (a) providing a semiconductor substrate and forming a gate structure on the semiconductor substrate; (b) implanting impurities of a first charge type to the semiconductor substrate with the gate structure serving as a mask to form a first source/drain region having a predetermined impurity concentration; (c) pocket-implanting impurities of a second charge type to the resulting semiconductor substrate with the gate structure serving as a mask to form a second source/drain region having a predetermined impurity concentration; and (d) forming a gate side wall on a flank of the gate structure, and implanting impurities of the first charge type to the resulting semiconductor substrate with the gate structure and the gate side wall serving as a mask to form a third source/drain region having a predetermined impurity concentration. The present invention is characterized in that no threshold voltage adjustment implantation to the semiconductor substrate is needed prior to the growth of the gate structure, and in stead, the diffusion ability of the pocket-implanted impurities in the step (c) can concurrently adjust the threshold voltage of the device.

13 Claims, 3 Drawing Sheets

PROCESS FOR FABRICATING MOS DEVICE HAVING SHORT CHANNEL

FIELD OF THE INVENTION

The present invention is related to a process for fabricating a MOS device, and more particularly to a process for fabricating a MOS device having a short channel.

BACKGROUND OF THE INVENTION

Metal-Oxide-Semiconductor (MOS) transistors have become the most important and essential electronic units in the field of current VLSI technologies. With the more and more complicated circuitry, the included MOS transistors are significantly increased so that to develop a technology that allows more electronic devices to be installed on a chip having a confined area to comply with the high density requirement is an urgent issue for semiconductor manufacturing, from which a few problems are derived.

For the fabrication of a chip having a high device density thereon, it is essential to reduce the size of the devices to be arranged on the chip. For a MOS transistor, when its size is reduced, the channel length thereof is also shortened and meanwhile the operation speed thereof is increased. The channel length, however, cannot be shortened infinitely because the so-called "short channel effects" will occur when the channel length is shortened to a certain extent. The short channel effects include the drop of the threshold voltage (Vt) and the carrier multiplication due to hot electron effects, finally resulting in the electrical breakdown phenomenon.

In the prior art, an implantation step for threshold voltage adjustment is performed prior to the formation of the gate structure to avoid the drop of the threshold voltage mentioned above. Please refer to FIGS. 1(a)~1(e) which are schematic diagrams showing, the respective steps of a conventional process for fabricating an N-channel MOS transistor. The chip shown in FIG. 1(a) is a p-type silicon chip which has been treated with procedures of washing, thermal oxidization and micro-lithography. The resulting chip is implanted with boron atoms as an implant source at an active area 111 thereof for threshold voltage adjustment, and then field oxide layers 112 and 113 are grown on the chip by wet oxidation. Afterwards, the silicon atoms distributed on the top face of the washed active area 111 are formed as a gate oxide layer 114 by dry oxidation, and a gate structure 115 is further formed above the gate oxide layer 114, as shown in FIG. 1(b). The gate structure 115 is formed by depositing a layer of polysilicon on the whole surface of the chip by a low-pressure chemical vapor deposition (LPCVD) process, doping VA group impurities in the is periodic table such as P or As into the polysilicon layer in a high concentration by a thermal diffusion or an ion implantation process to reduce the resistivity, washing the resulting chip with a solution containing hydrogen fluoride, depositing a silicide layer (preferably a tungsten silicide layer) on the washed chip, defining the gate structure 115 by a micro-lithographic process, and then performing an annealing process to obtain the construction as shown in FIG. 1(b).

Afterwards, VA group impurities in the periodic table such as phosphorous atoms are implanted with the resulting grate serving as a mask, The concentration of the impurities implanted in this step is relatively low, and it is controlled at an amount of about $10^{13}$ per cubic centimeter. Accordingly, lightly doped drain (LDD) regions 116 as shown in FIG. 1(c) is formed to prevent the short channel effects in the prior art. Further, a silicon oxide layer is deposited by a CVD process, then the resulting chip is transferred to a thermal diffusion oven for the diffusion of the phosphorous atoms, and a part of the silicon atom structure on the surface of the chip, which is damaged in the impurity implantation process, is annealed at the same time. Now referring to FIG. 1(d), gate side walls 117 are obtained by an anisotropic etching process. Subsequently, VA group impurities in the periodic table such as arsenic atoms are heavily doped with the gate side walls and the gate electrode serving as a mask to form the main portions of a source and a drain electrodes, as shown in FIG. 1(e). The impurity concentration implanted in this step is controlled at an amount of about $10^{15}$ per cubic centimeter. As known to those skilled in the art, in the manufacturing process for a semiconductor device, the more the steps required in the process, the more the variables and the lower the yield. In addition, the production efficiency will be adversely effected and the manufacturing cost will be improperly increased if too many steps have to be performed in the manufacturing process. Therefore, the reduction of the number of steps required in a manufacturing process for a semiconductor device without deteriorating the semiconductor device is the goal of the present research and development.

SUMMARY OF THE INVENTION

Therefore, a major object of the present invention is to provide a process for fabricating a MOS device, which omits a step of threshold voltage adjustment with immunity from the drop of the threshold voltage even though the MOS device is made to have a short channel.

The present invention is related to a process for fabricating a MOS device having a short channel. The process according to the present invention includes the steps of (a) providing a semiconductor substrate and forming a gate structure on the semiconductor substrate, (b) implanting impurities of a first charge type to the semiconductor substrate Keith the gate structure serving as a mask to form a first source/drain region having a predetermined impurity concentration; (c) pocket-implanting impurities of a second charge type to the resulting semiconductor substrate with the gate structure serving as a mask to form a second source/drain region having a predetermined impurity concentration; and (d) forming a gate side wall on a flank of the gate structure, and implanting impurities of the first charge type to the resulting semiconductor substrate with the gate structure and the gate side wall serving as a mask to form a third source/drain region having a predetermined impurity concentration, and the present process is characterized in that no threshold voltage adjustment implantation to the semiconductor substrate is needed prior to the growth of the gate structure, and in stead, the diffusion ability of the pocket-implanted impurities in the step (c) can concurrently adjust the threshold voltage of the device.

In a preferred embodiment according to the present invention, the second source/drain region is located between the first source/drain region and the third source/drain region. In this case, the predetermined impurity concentration of the third source/drain region is preferably higher than that of the first source/drain region.

In accordance with the present invention, the impurities of the first charge type can be VA group elements in the periodic table, for example phosphorous atoms. In this case, the impurities of the second charge type are preferably IIIA group elements in the periodic table, for example boron atoms.

Alternatively, the impurities of the first charge type can be IIIA group elements in the periodic table, for example boron atoms, and the impurities of the second charge type can be VA group elements in the periodic table, for example phosphorous atoms.

In accordance with another aspect of the present invention, the gate structure is composed of a gate oxide layer and a polysilicon gate layer.

In step (c), the impurities are pocket-implanted to the semiconductor substrate preferably at an angle between about 30 and about 60 degrees.

The present invention will be illustrated in details with reference to the accompany drawings, in which:

DETAILED DESCRIPTION OF THE PREFERRED EMBODIMENTS

A manufacturing process for an N-channel MOS transistor will be taken as an example according to the present invention and illustrated as follows.

Figure 1A:
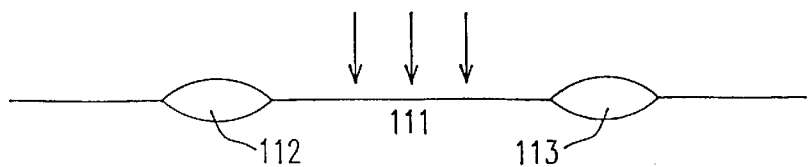
FIGS. 1(a)~1(e) are schematic diagrams showing the respective steps of a conventional process for fabricating an N-channel MOS transistor.
Figure 1B:
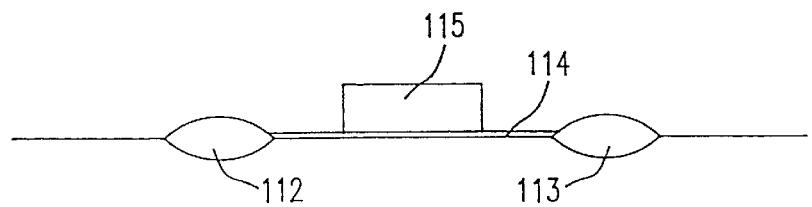
Figure 1C:
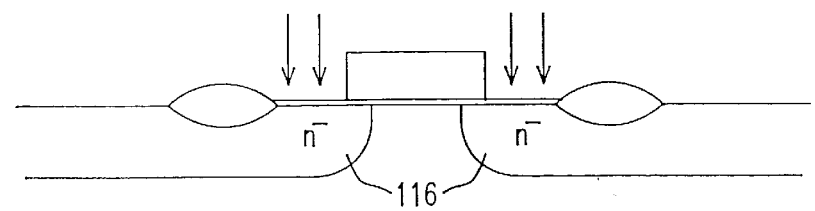
Figure 1D:
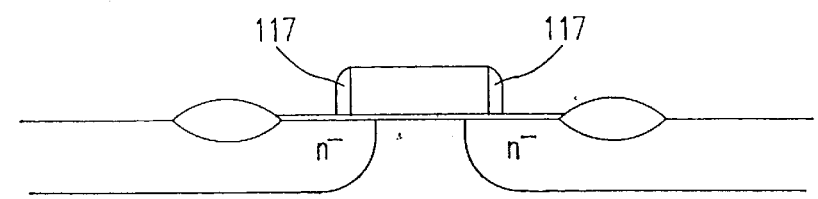
Figure 1E:
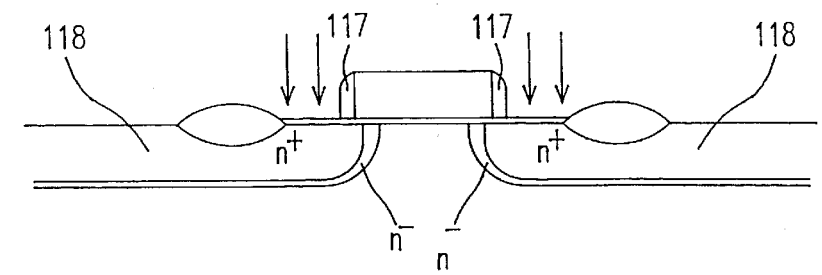
Figure 2A:
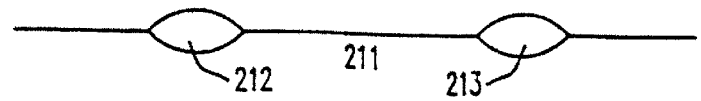
FIGS. 2(a)~2(f) are schematic diagrams showing the respective steps of a preferred embodiment of a process for fabricating an N-channel MOS transistor according to the present invention.
Figure 2B:
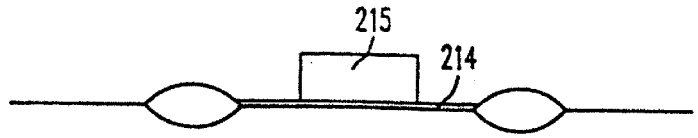

Please refer to FIGS. 2(a)~2(f) which are schematic diagrams showing the respective steps of a preferred embodiment of a process for fabricating an N-channel MOS transistor according to the present invention. The chip shown in FIG. 2(a) is a p-type silicon chip which has been treated with procedures of washing, thermal oxidization and micro-lithography, and then two layers of field oxide 212 and 213 are grown on the chip by diet oxidation. Afterwards, the silicon atoms distributed on the top face of an active area 211 of the chip are formed as a gate oxide layer 214 by dry oxidation, and a gate structure 215 is further formed above the gate oxide layer 214, as shown in FIG. 2(b). The gate structure 215 is formed by depositing a layer of polysilicon on the whole surface of the chip by a low-pressure chemical vapor deposition (LPCVD) process, doping VA group impurities in the periodic table such as P or As into the polysilicon layer in a high concentration by a thermal diffusion or an ion implantation process to reduce the resistivity, washing the resulting chip with a solution containing hydrogen fluoride, depositing a suicide layer (preferably a tungsten suicide layer) on the washed chip, defining the gate structure 215 by a micro-lithographic process, and then performing an annealing process to obtain the construction as shown in FIG. 2(b). It is to be noted that the step of implanting boron atoms into the chip at an active area for threshold voltage adjustment before forming field oxide layers is not necessary according to the present invention owing to the difference in the subsequent implantation steps between the present invention and the prior art illustrated with reference to FIG. 1.

Figure 2C:
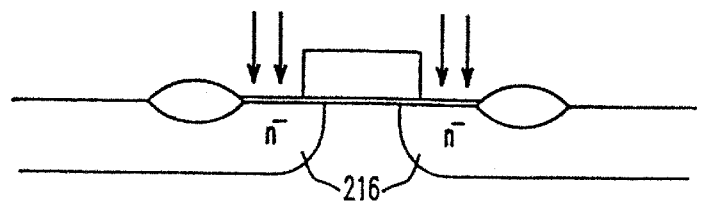
Figure 2D:
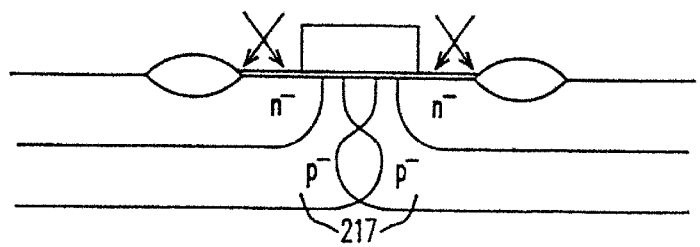
Figure 2E:
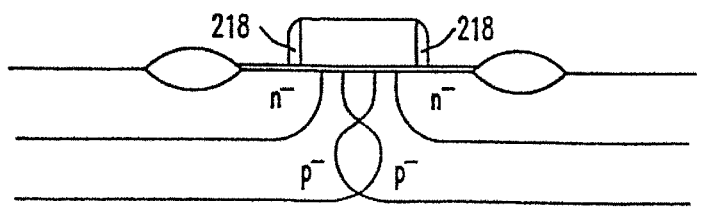
Figure 2F:
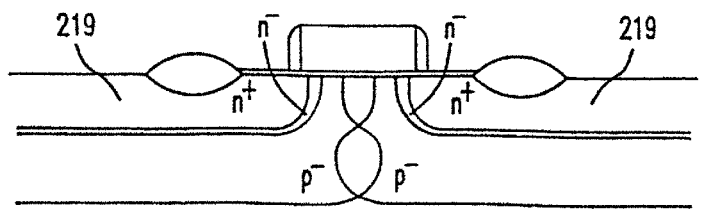

VA group impurities in the periodic table such as phosphorous atoms are implanted with the gate structure 215 serving as a mask, thereby forming n-type first source/drain regions 216, as shown in FIG. 2(c). The implantation energy is in a range between about 10 keV and about 30 keV, and the concentration of the impurities implanted in this step is controlled in a range between about $10^{13}$ per cubic centimeter and about $3\times10^{13}$ per cubic centimeter. Afterwards, IIIA group impurities in the periodic table such as boron atoms are pocket-implanted at an angle ranged between about 30 and about 60 degrees with the gate structure 215 serving as a mask, thereby forming second source/drain regions 217 having a pocket shape, as shown in FIG. 2(d). Further, a silicon oxide layer is deposited by a CVD process, then the resulting chip is transferred to a thermal diffusion oven for the diffusion of the phosphorous atoms, and a part of the silicon atom structure on the surface of the chip, which is damaged in the impurity implantation process, is annealed at the same time. Now referring to FIG. 2(e), gate side walls 218 are obtained by an anisotropic etching process. Subsequently, VA group impurities in the periodic table such as arsenic atoms are heavily doped with the gate side walls and the gate electrode serving as a mask to form third source/drain regions 219 as the main portions of a source and a drain electrodes, as shown in FIG. 2(f). The implantation energy is in a range between about 30 keV and about 50 keV, and the concentration of the impurities implanted in this step is controlled in a range between about $10^{13}$ per cubic centimeter and about $3\times10^{13}$ per cubic centimeter.

If a P-channel MOS transistor is to be fabricated according to the present invention, the same procedures can be performed except that the substrate and the impurities to be implanted need to be replaced by the proper ones.

It is obvious from the above illustration that the step of implanting boron atoms into the chip for threshold voltage adjustment can be omitted in the present process because of the utilization of the subsequent pocket implant process. The pocket implantation for improving the punch-through immunity can concurrently adjust the threshold voltage of the channel by means of the diffusion of the pocket-implanted impurities. This advantage is more prominent for the fabrication of a MOS transistor having a short channel. By comparing the chip shown in FIG. 2(f) With that shown in FIG. 1(e), it is obvious that when the active area is getting smaller, it is more and more difficult for the size of the LDD regions 116 formed according to the prior process to be controlled whereby the regions 116 are likely to overlap under this circumstance, and on the contrary, the channel length of the device fabricated according to the present invention can be shortened without deteriorating the device.

Figure 3:
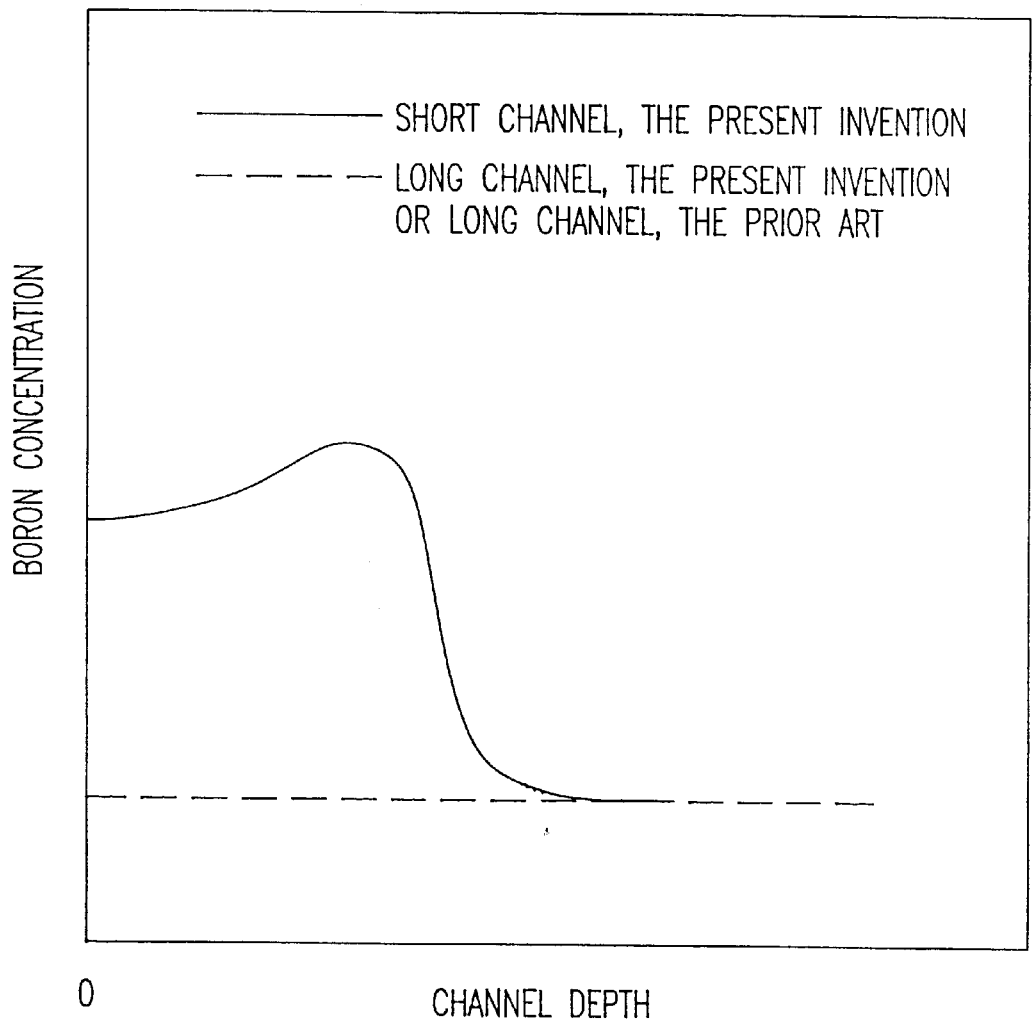
FIG. 3 is boron concentration vs. channel depth plot showing the boron concentrations measured at the middle points of the gate electrodes of MOS transistors respectively having a long channel and a short channel fabricated according to the present invention and a MOS transistor having a long channel fabricated according to a conventional process.

On the other hand, the present process disclosed here, of course, can also be applied to the fabrication of a MOS device having a relatively long channel. A boron concentration vs. channel depth plot showing the boron concentrations measured at the middle points of the gate electrodes of N-channel MOS transistors respectively having a long channel and a short channel fabricated according to the present invention and an N-channel MOS transistor having a long channel fabricated according to a conventional process is depicted in FIG. 3. As shown in FIG. 3, the boron concentration variation of the long-channel MOS device fabricated according to the present invention with the channel depth is substantially the same as that of the MOS device fabricated according to the prior process without pocket implantation.

It should be understood that the scope of the present invention is not limited to the particular embodiment disclosed herein as the best mode contemplated for carrying the present invention. In stead, the scope and the spirit of the present invention are as defined in the appended claims.

What is claimed is:

1. A process for fabricating a MOS device having a short channel, said process comprising the steps of:
   (a) providing a semiconductor substrate and forming a gate structure on said semiconductor substrate;
   (b) implanting impurities of a first charge type to said semiconductor substrate with said gate structure serving as a mask to form first source and drain regions having a first impurity concentration;
   (c) pocket-implanting impurities of a second charge type to said resulting semiconductor substrate of said step (b) with said gate structure serving as a mask to form second source and drain regions having a second impurity concentration, the second source region and the second drain region having an overlapping region, the overlapping region being separated from the gate structure by a portion of the semiconductor substrate; and,
   (d) forming a gate side wall on a flank of said gate structure, and implanting impurities of said first charge type to said resulting semiconductor substrate of said step (c) with said gate structure and said gate side wall serving as a mask to form third source and drain regions having a third impurity concentration; and characterized in that no threshold voltage adjustment implantation to said semiconductor substrate is needed prior to the growth of said gate structure, a diffusion ability of said pocket-implanted impurities in said step (c) concurrently adjusting the threshold voltage of said device.

2. The process according to claim 1, wherein said second source and drain regions are located between said first source and drain regions and said third source and drain regions.

3. The process according to claim 2, wherein said third impurity concentration is higher than said first impurity concentration.

4. The process according to claim 1 wherein said impurities of said first charge type are VA group elements in the periodic table.

5. The process according to claim 4 wherein said impurities of said first charge type are phosphorous atoms.

6. The process according to claim 4 wherein said impurities of said second charge type are IIIA group elements in the periodic table.

7. The process according to claim 6 wherein said impurities of said second charge type are boron atoms.

8. The process according to claim 1 wherein said impurities of said first charge type are IIIA group elements in the periodic table.

9. The process according to claim 8 wherein said impurities of said first charge type are boron atoms.

10. The process according to claim 8 wherein said impurities of said second charge type are VA group elements in the periodic table.

11. The process according to claim 10 wherein said impurities of said second charge type are phosphorous atoms.

12. The process according to claim 1 wherein said gate structure is composed of a gate oxide layer and a polysilicon gate layer.

13. The process according to claim 1 wherein said impurities are pocket-implanted to said semiconductor substrate at an angle between about 30 and about 60 degrees in said step (c).

* * * * *